United States Patent
Bauer (10) Patent No.: US 6,239,657 B1
(45) Date of Patent: May 29, 2001

(54) METHOD AND DEVICE FOR MEASURING THE DISTORTION OF A HIGH-FREQUENCY POWER AMPLIFIER AND METHOD AND MEANS FOR AUTOMATICALLY EQUALIZING A HIGH-FREQUENCY POWER AMPLIFIER

(75) Inventor: Helmut Bauer, Weyarn (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 09/413,308

(22) Filed: Oct. 6, 1999

Related U.S. Application Data (63) Continuation of application No. PCT/EP98/04717, filed on Jul. 28, 1998.

(30) Foreign Application Priority Data

Mar. 27, 1998 (DE) .............................................. 198 13 703

(51) Int. Cl.[7] ....................................................... H03F 1/26
(52) U.S. Cl. ........................... 330/149; 375/297; 455/126
(58) Field of Search ........................... 330/149; 375/297; 455/126

(56) References Cited

U.S. PATENT DOCUMENTS

| | | | |
|---|---|---|---|
| 4,291,277 | * | 9/1981 | Davis et al. .......................... 330/149 |
| 4,700,151 | * | 10/1987 | Nagata ................... 330/149 |
| 5,448,203 | * | 9/1995 | Matui et al. ........................ 455/126 |
| 5,699,383 | * | 12/1997 | Ichiyoshi ............................. 375/297 |
| 5,867,065 | * | 2/1999 | Leyendecker ........................ 340/149 |
| 5,900,778 | * | 5/1999 | Stonick et al. ....................... 330/149 |
| 5,905,760 | * | 5/1999 | Schnabl et al. ...................... 375/297 |
| 5,959,500 | * | 9/1999 | Garrido ............................... 375/297 |
| 6,081,698 | * | 6/2000 | Moriyama et al. ................... 375/297 |
| 6,141,390 | * | 10/2000 | Cova ................................... 375/297 |

FOREIGN PATENT DOCUMENTS

| | | |
|---|---|---|
| 30 33 999 A1 | 4/1981 | (DE) . |
| 31 14 244 A1 | 4/1982 | (DE) . |
| 0 289 130 A1 | 11/1988 | (EP) . |
| WO 97/49174 | 12/1997 | (WO) . |

OTHER PUBLICATIONS

Mohammad Ghaderi, et al., "Power Amplifier Adaptive Linearization Using Predistortion with Polynomial Functions," Proceedings of the European Microwave Conference, ESP00, Finland, Aug. 24–27, 1992.

(List continued on next page.)

Primary Examiner—Benny Lee
Assistant Examiner—Khanh Van Nguyen
(74) Attorney, Agent, or Firm—Schiff Hardin & Waite (57) ABSTRACT

An equalizer for automatically equalizing a high-frequency power amplifier having a reference carrier generator which generates a reference carrier from a measured input signal of the high-frequency power amplifier, and a first synchronous demodulator while generating an input envelope curve from the measured input signal and from the reference carrier. A second synchronous demodulator which generates an in-phase component of an output envelope curve from the measured output signal of the high-frequency power amplifier and from the reference carrier, as well as a phase shifter which shifts the phase of the reference carrier 90° are also provided. A third synchronous demodulator generates a quadrature component of the output envelope curve from the measured output signal of the high-frequency power amplifier and from the reference carrier that has been shifted 90° in phase. A controller generates an amplitude correction control signal and/or a phase correction control signal from the input envelope curve, the in-phase component of the output envelope curve and/or the quadrature component of the output envelope curve. The control characteristic and/or phase characteristic of a predistorter is adjusted inversely to the control characteristic and/or phase characteristic of the high-frequency power amplifier by the amplitude correction factor and the phase correction factor.

18 Claims, 7 Drawing Sheets

OTHER PUBLICATIONS

Bellis M., "An Energy Efficient UHF Power Amplifier for Existing and Proposed Transmission Systems," Broadcast Sessions, Montreux, Jun. 10–15, 1993.

Schniessek, C., "Gruppenlaufzeit und ihre Messung", In: mikrowellen magazin, vol. 12, No. 2, 1986, pp. 122–125.

Gommlich, H., et al., Verzerrungsmessungen–wichtige Aufgabe in der Ubertragungstechnick, In: Elektronik 8/23.4.198, pp. 110–118; 1982.

* cited by examiner

METHOD AND DEVICE FOR MEASURING THE DISTORTION OF A HIGH-FREQUENCY POWER AMPLIFIER AND METHOD AND MEANS FOR AUTOMATICALLY EQUALIZING A HIGH-FREQUENCY POWER AMPLIFIER

RELATED PATENT APPLICATION INFORMATION

This application is a continuation of international application No. PCT/EP98/04717 filed Jul. 28, 1998, and fully incorporated herein by reference.

BACKGROUND OF THE INVENTION

The invention relates to a method for measuring the distortion of a high-frequency power amplifier and to a corresponding measuring device. The invention also relates to an equalizing method for automatically equalizing a high-frequency power amplifier and to a corresponding equalizing means.

High-frequency power amplifiers usually do not have an entirely linear characteristic. This causes a distortion of the high-frequency signal that is amplified by the high-frequency power amplifier. Thus, due to the non-linearities of the high-frequency power amplifier, an undesirable noise spectrum emerges.

Given multi-carrier signals such as are used in the digital transmission of audio and video signals, the noise spectrum is expressed in extraband disturbances, which lie outside the transmission band, and intraband disturbances, which lie inside the transmission band. To guarantee a perfect transmission of the multi-carrier signal, the noise spectrum must comprise a predetermined level distance from the useful signal. Therefore, relatively high requirements are set for the linearity of high-frequency power amplifiers in the output stage of an amplifier for DAB (Digital Audio Broadcasting) signals and DVB (Digital Video Broadcasting) signals.

Previously, in the balancing of high-frequency power amplifiers of this type, it was common to feed a multi-carrier balancing signal to the input and to observe the output signal of the high-frequency power amplifier with a spectrum analyzer. In the signal path prior to the high-frequency power amplifier, a predistorting means was arranged, which permits a predistorting of the high-frequency signal that is to be amplified. The predistortion characteristic is defined by a diode resistance network with variable resistances, so that the curve of the predistortion characteristic can be variably adjusted by a plurality of parameters. By varying the adjustment parameters of the predistortion network, it was then iteratively attempted to achieve an optimally large shoulder spacing between the useful signal and the noise signal in the output spectrum of the high-frequency power amplifier. Since there is no strategy for adjusting the individual parameters of the predistortion network, and the adjustments of the individual parameters have a mutual influence on one another, this procedure is extremely time-consuming and thus expensive. Furthermore, an adjustment that has been found is dependent on the temperature, the age of the components of the high-frequency power amplifier, and other influences.

SUMMARY OF THE INVENTION

It is thus an object of the present invention to provide a suitable measuring method for measuring the distortion of a high-frequency power amplifier and a suitable method for automatically equalizing a high-frequency power amplifier, as well as a corresponding measuring means and a corresponding equalizing means.

To that end, in an embodiment, the invention provides a method of measuring the distortion of a high-frequency power amplifier comprising the following steps:
  a) measuring an input signal and an appertaining output signal of the high-frequency power amplifier;
  b) separating the input signal of the high-frequency power amplifier into an input envelope curve and a reference carrier;
  c) generating an output envelope curve of the output signal of the high-frequency amplifier with the aid of the reference carrier that is generated from the input signal; and
  d) displaying a control characteristic of the high-frequency power amplifier in the form of the amplitude or the power of the output envelope curve as a function of the amplitude or power of the input envelope curve.

In an embodiment, the invention provides an apparatus which measures the distortion of a high-frequency power amplifier, comprising:
  a) a reference carrier generator which generates a reference carrier from a measured input signal of the high-frequency power amplifier;
  b) a first synchronous demodulator which generates an input envelope curve from the measured input signal and the reference carrier;
  c) a second synchronous demodulator which generates an in-phase component of an output envelope curve from the measured output signal of the high-frequency power amplifier and from the reference carrier;
  d) a phase shifter which shifts the phase of the reference carrier 90°;
  e) a third synchronous demodulator which generates a quadrature component of the output envelope curve from the measured output signal of the high-frequency power amplifier and from the reference carrier, which has been shifted 90° in phase;
  f) a first display which displays a control characteristic of the high-frequency power amplifier in the form of the amplitude or power of the output envelope curve as a function of the amplitude or power of the input envelope curve; and
  g) a second display which displays a phase characteristic of the high-frequency power amplifier in the form of the phase angle of the output signal, which is defined by the ratio of the quadrature component to the in-phase component, as a function of the amplitude or power of the input envelope curve or as a function of the amplitude or power of the output envelope curve.

In an embodiment, the invention provides an equalization apparatus which automatically equalizes a high-frequency power amplifier, comprising:
  a) a reference carrier generator which generates a reference carrier from a measured balancing input signal of the high-frequency power amplifier;
  b) a first synchronous demodulator which generates an input envelope curve from the measured balancing input signal and from the reference carrier;
  c) a second synchronous demodulator which generates an in-phase component of an output envelope curve from a measured balancing output signal of the high-frequency power amplifier and from the reference carrier;

d) a phase shifter which shifts the phase of the reference carrier 90°;

e) a third synchronous demodulator which generates a quadrature component of the output envelope curve from the measured output signal of the high-frequency power amplifier and from the reference carrier, which has been shifted 90° in phase;

f) a controller which generates an amplitude correction control signal and/or a phase correction control signal from the input envelope curve, the in-phase component of the output envelope curve and/or the quadrature component of the output envelope curve; and g) a signal predistorter means, whose control characteristic and phase characteristic are adjusted in the balancing mode inversely to the control characteristic and/or the phase characteristic of the high-frequency power amplifier, by the amplitude correction factor and/or by the phase correction factor;

wherein, the control characteristic is defined by the amplitude or power of the output envelope curve as a function of the amplitude or power of the input envelope curve, and the phase characteristic is defined by the phase angle of the output signal as a function of the amplitude or power of the input envelope curve or as a function of the amplitude or power of the output envelope curve.

The inventive measuring method has the advantage that the control characteristic of the high-frequency power amplifier is directly indicated. The operator thus has an effective balancing criterion in the balancing of the high-frequency power amplifier, or respectively, of a predistorting means arranged in front of the high-frequency power amplifier; namely, to achieve an optimally extensive linearizing of the control characteristic.

The generation of the output envelope curve and the input envelope curve advantageously occurs by means of synchronous demodulation. To indicate the phase angle, both an in-phase component and a quadrature component are generated by the output envelope curve. The phase angle of the output signal can be determined from the ratio of these two components. The synchronous demodulation of the in-phase component and the quadrature component advantageously occurs in separate synchronous demodulators. In addition, the reference carrier advantageously undergoes a phase shift corresponding to the signal transit-time delay caused by the high-frequency amplifier.

The advantage of the inventive equalization method consists in the obtaining, by a suitable balancing signal, of an amplitude correction factor for the input signal of the high-frequency power amplifier in a balancing mode and in the subjecting of the input signal to an automatic amplitude predistortion in consideration of the amplitude correction factor. The balancing of the predistorting means occurs automatically, reducing the time outlay for the startup considerably.

In addition, a phase correction factor is preferably obtained, and the input signal is subjected to an automatic phase predistortion with the aid of the phase correction factor.

The amplitude correction factor, and, as warranted, the phase correction factor are fed to a predistorting means, whose control characteristic and, as warranted, phase characteristic are automatically set inversely to the control characteristic and phase characteristic of the high-frequency amplifier. The input envelope curve and the output envelope curve are advantageously digitized and fed to a control computer for purposes of calculating the amplitude correction factor and, as warranted, the phase correction factor.

An amplitude-modulated single-carrier signal can serve, particularly easily, as balancing signal. Another particularly suitable balancing signal is a multi-carrier wherein all the carriers are in the same phase state. This balancing signal is relatively close to the useful signal, but does not comprise any phase changes and is thus particularly suitable for the balancing. In principle, the useful signal can also be considered for the balancing signal, however.

If the high-frequency power amplifier is composed modularly from a plurality of structurally identical subamplifiers arranged in parallel fashion, it is sufficient to balance only one of the subamplifiers with the inventive equalization method and to accept the predistortion factors for the input signals of the other subamplifiers the same way.

These and other features of the invention are discussed in greater detail below in the following detailed description of the presently preferred embodiments with reference to the accompanying drawings.

DETAILED DESCRIPTION OF THE PRESENTLY PREFERRED EMBODIMENTS

Figure 1:
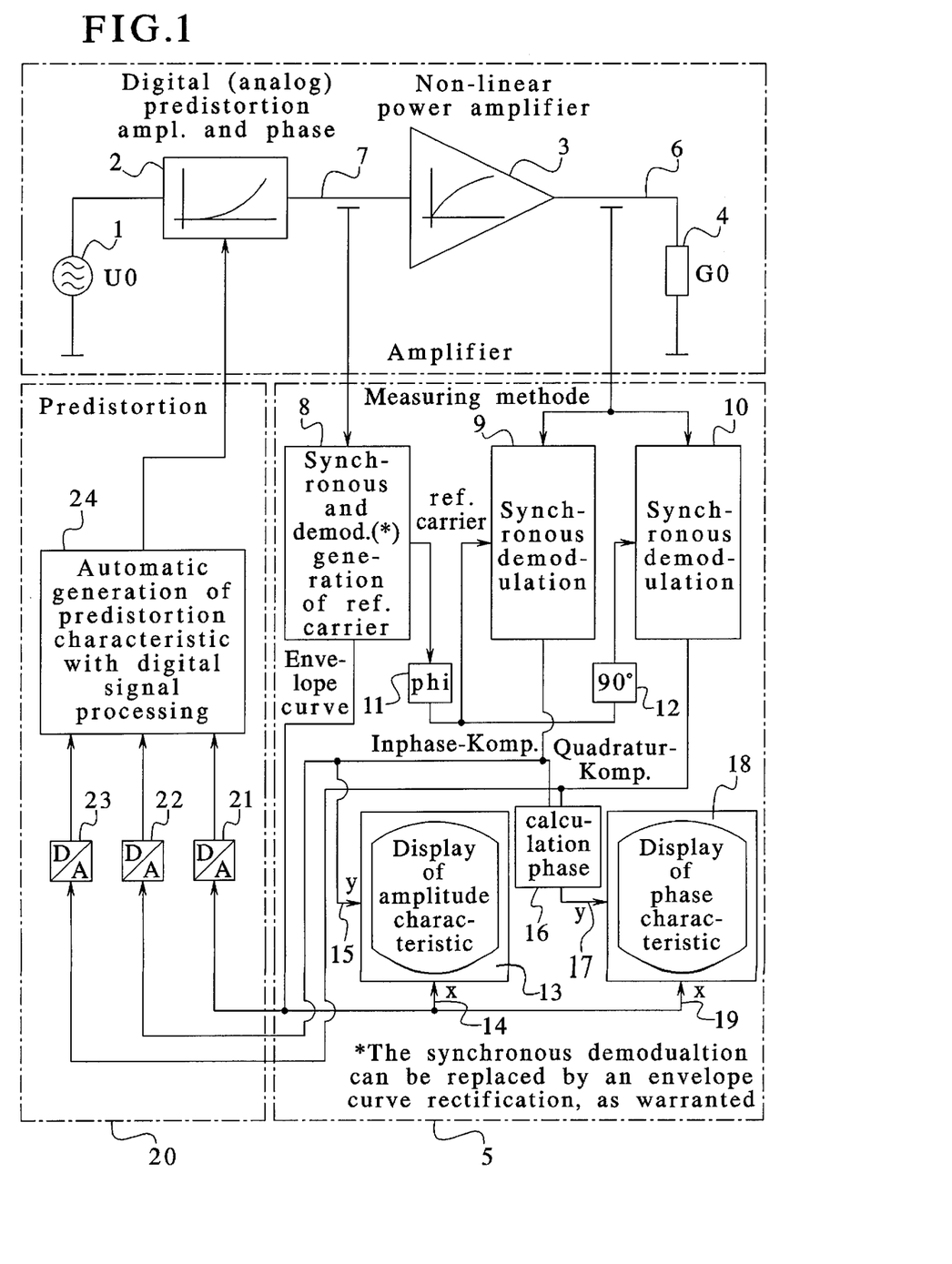
FIG. 1 is a block wiring diagram of the inventive measuring means and the inventive equalization means.

FIG. 1 depicts a block wiring diagram of the inventive means for measuring the distortion of a high-frequency power amplifier. Additional components for the inventive equalizing means for the automatic equalizing of the high-frequency power amplifier are also illustrated in the same block wiring diagram.

In FIG. 1, a balancing signal that is generated by a signal source 1 is fed to the input of a high-frequency power amplifier 3 via a predistorting means 2. At the output of the high-frequency power amplifier 3, there is a load resistance 4, e.g. the supply resistance of a transmitting antenna.

As is schematically illustrated in FIG. 1, conditional to its construction, the power amplifier has an incompletely linearized control characteristic and a phase characteristic. The control characteristic should be understood hereinafter as the output power of the high-frequency power amplifier as a function of its input power. The control characteristic can also be defined as the output amplitude as a function of the input amplitude, however. Phase characteristic is to be understood hereinafter as the output phase characteristic, i.e. the output phase of the high-frequency power amplifier as a function of its output power. The phase characteristic can also be defined as the output phase as a function of the output amplitude of the function of the input power or input amplitude.

Both the input signal 7 of the high-frequency power amplifier 3 and the output signal 6 of the high-frequency power amplifier are measured and fed to the inventive measuring means 5. The input signal 7 is first divided into the input envelope curve and the reference carrier. It is assumed here that the input signal $U_E(t)$ can be represented as the product of the input envelope curve $U_{HE}(t)$ and an angle modulation portion:

$$U_E(t) = U_{HE}(t) \sin(\omega t + \phi(t)) \tag{1}$$

The input envelope curve $U_{HE}(t)$ can thus be generated by means of a first synchronous demodulator 8, to which the reference carrier, which has been separated from the input signal, and the input signal $U_E(t)$ are fed.

In a corresponding manner, the output signal is fed to a second synchronous demodulator 9 and to a third synchronous demodulator 10. The reference carrier is preferably shifted in a phase shifter 11 by an amount corresponding to the signal transit time in the high-frequency power amplifier 3. In the second synchronous demodulator 9, a synchronous demodulation occurs with the measured output signal 6 and the reference carrier, which has been shifted in phase by the signal transit time. The output signal of the synchronous demodulator 9 is an in-phase component of the envelope curve of the output signal. The output signal of the first phase shifter 1 is fed to a second phase shifter 12, which additionally shifts the reference carrier 90° in phase. The measured output signal 6 and the reference carrier, which has been additionally shifted 90° in phase, are fed to the third synchronous demodulator 10, so that the third synchronous demodulator 10 generates a quadrature component of the envelope curve of the output signal.

The synchronous demodulators 8 and 9 can be replaced by envelope-curve rectifiers for purposes of simplification, or respectively, cost savings.

The amplitude characteristic of the high-frequency power amplifier 3 is displayed at a first display means 13, e.g. an oscillograph, a storage oscillograph, or a computer monitor. The input envelope curve which is obtained by the first synchronous demodulator 8 is fed to an x-input 14 of the first display means 13, and the in-phase component, which is obtained by the second synchronous demodulator 9, of the output envelope curve is fed to the y-input of the first display means 13. The output amplitude of the high-frequency power amplifier 3 is thus displayed as a function of the input amplitude of the high-frequency power amplifier 3. If, instead of the amplitude characteristic, the control characteristic of the high-frequency power amplifier 3 is to be represented, in such a form that the output power of the high-frequency power amplifier is displayed as a function of the input power, then the input signals at the inputs 14 and 15 should be squared in amplitude by corresponding squaring elements (not illustrated).

Together with the in-phase component that is generated by the second synchronous demodulator 9, the quadrature component, which is generated by the third synchronous demodulator 10, of the output envelope curve serves to generate the phase characteristic. To this end, the phase angle P is determined in a means 16, either digitally or in analog fashion, by means of the following equation:

$$\beta(t) = \arctan(U_{Quadratur} / U_{Inphase}) \tag{2}$$

Here, the quadrature component $U_{Quadratur}$ represents the imaginary portion of the output envelope curve, and the in-phase component $U_{Inphase}$ represents the real portion of the output envelope curve, so that the output phase angle β can be calculated with the formula (2). The output phase angle thus calculated is fed to the y-input 17 of a second display device 18. The input envelope curve which is generated by the first synchronous demodulator 8 is fed to the x-input 19 of the second display means 18. In the diagrams illustrated in FIGS. 3, 7 and 12, the output phase β is represented as a function of the output power. To this end, the in-phase component of the output envelope curve, which is squared in a squaring element (not illustrated), is fed to the x-input of the second display device 18.

The inventive measuring method, or respectively, the inventive measuring means 5 allows the operator to perform an adjustment of the predistorting means 2 such that the control characteristic, or respectively, the amplitude characteristic runs optimally linearly, and the phase shift brought about by the high-frequency power amplifier 3 is optimally constant (preferably being zero) for all amplitudes of the input signal, or respectively, for all output powers. The sum of the amplitude predistortions due to the distorting means 2 and the high-frequency power amplifier 3, and the sum of the phase distortion due to the predistorting means 2 and the high-frequency power amplifier 3 are optimally low. This allows the operator to quickly adjust the predistorting means 2 in consideration of the aforementioned balancing criteria. The balancing of the predistorting means 2 occurs considerably more quickly and more purposefully than given the mere observation of the shoulder spacing between the useful signal and the noise signal in the output spectrum of the high-frequency power amplifier 3. The output spectrum of the high-frequency power amplifier 3 can, of course, be consulted as an additional criterion in the inventive procedure also.

The adjustment of the predistorting means 2 need not necessarily occur manually according to the above balancing criteria, but can also occur automatically by means of the inventive equalization method and the inventive equalizing means 5, 20, which consists of the above described measuring means 5 and the predistorting means 20.

In the exemplary embodiment illustrated in FIG. 1, the input envelope curve is thus digitized in a first analog/digital converter 21, the in-phase component of the output envelope curve is digitized in a second analog/digital converter, and the quadrature component of the output envelope curve is digitized in a third analog/digital converter 23. The digitized envelope curve signals are fed to a control computer 24 for performing a digital signal processing. The control computer 24 calculates an amplitude correction factor and/or a phase correction factor, by which the useful input signal is multiplied in the predistorting means 2, thereby predistorting it.

The amplitude correction factor, which is dependent on the amplitude of the input signal, is obtained easily in that the inverse function of the amplitude characteristic that is obtained by the measuring means 5 is generated. The amplitude characteristic of the predistorting means 2 is thus the inverse of the amplitude characteristic of the high-frequency power amplifier 3, which is illustrated schematically in FIG. 1. The inverse function can be easily generated in that the input values and the output values are interchanged in a memory. To achieve a clear allocation of the input values to the output values, the amplitude characteristic can first be sampled and averaged at predetermined interpolation points and can subsequently be subjected to an interpolation.

The phase correction factor is $e^{-i\beta}$, $\beta$ being the output phase of the high-frequency power amplifier 3, which is obtained by the measuring means 5, as a function of the amplitude of the input signal. Instead of a digital controlling of the predistorting means 2, the controlling can of course also occur by means of an analog network.

The advantage of the automatic generation of the predistortion characteristic for the predistorting means 2 consists in the ability to perform an automatic balancing, relatively rapidly, in the startup of the high-frequency power amplifier 3 and to automatically readjust the predistortion characteristic from time to time, as needed, if, for example, the operating temperature of the high-frequency power amplifier 3 changes, or if the components, particularly the active amplifying element, of the high-frequency power amplifier 3 change in their characteristic due to aging.

In principle, the useful signal can serve as balancing signal in the balancing mode. However, a specific balancing signal such as an amplitude-modulated single carrier or a narrowband multi-carrier signal is advantageously used, all the carriers in said signal being in a defined phase state, preferably the same one. If the high-frequency power amplifier is composed modularly of a plurality of structurally identical subamplifiers arranged in parallel fashion, it is sufficient to balance only one of the subamplifiers and to accept the predistortion characteristics for the predistorting unit for the other subamplifiers 2, respectively.

Figure 11:
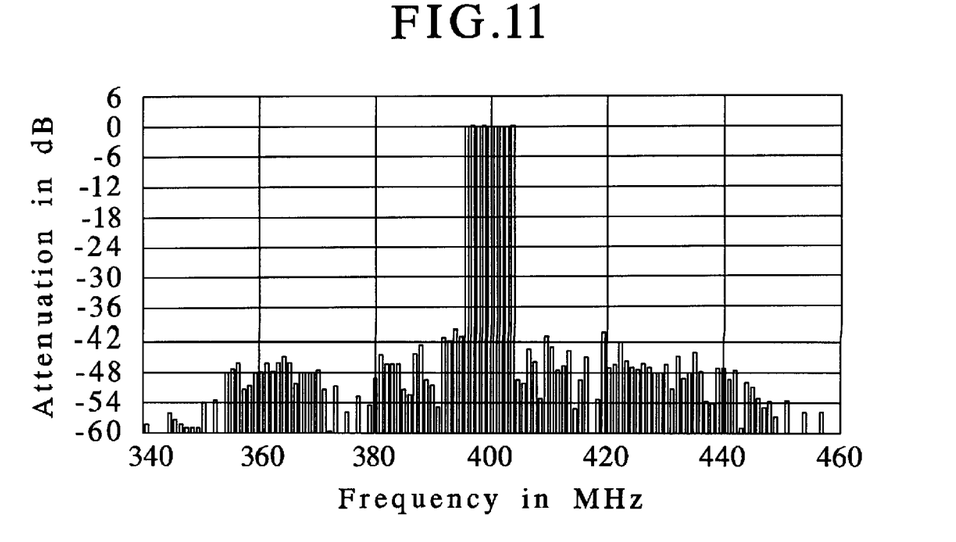
FIG. 11 illustrates the output spectrum of the high-frequency power amplifier, given a multi-carrier input signal that is predistorted both in amplitude and in phase.
Figure 12:
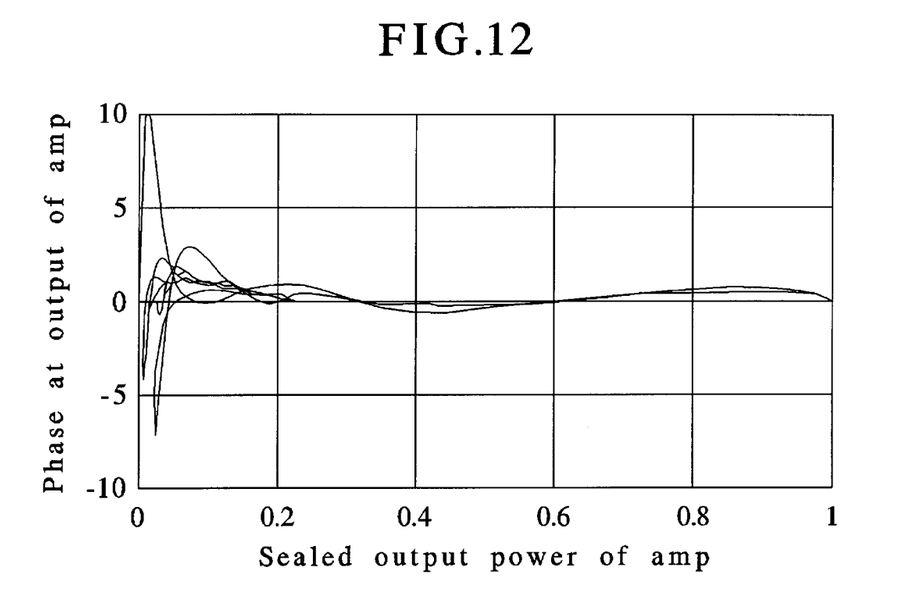
FIG. 12 illustrates the phase characteristic of the high-frequency power amplifier, given a multi-carrier input signal that is predistorted in both amplitude and phase.
Figure 13:
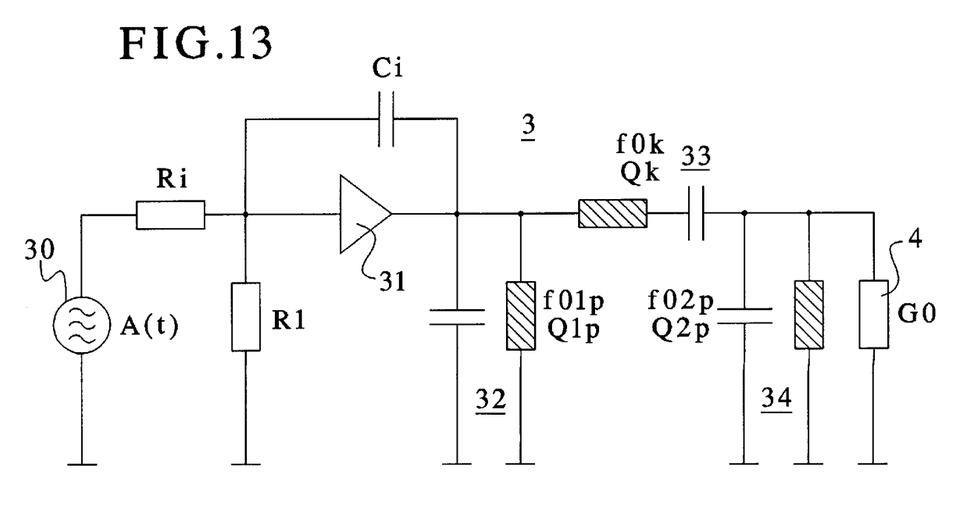
FIG. 13 illustrates an equivalent circuit diagram of the high-frequency power amplifier.

For a better understanding of the invention and to illustrate the functioning of the invention, FIGS. 2 to 12 illustrate several simulation results, which have been verified by measurements using a real high-frequency power amplifier 3. The simulation of the high-frequency power amplifier 3 was based on the equivalent circuit diagram which is illustrated in FIG. 13. The signal A(t) of the input signal source 30 was delivered to an amplifying element 31 via a resistance network Ri and R1. Via the capacitor Ci, a back-feeding occurs from the output to the input of the amplifying element 31. The output network of the high-frequency power amplifier 3 consists of three resonant circuits 32, 33, and 34 which are interconnected as π-filters, the resonant circuits 32 and 34 being constructed as parallel resonant circuits and the resonant circuit 33, as a serial resonant circuit. The resonant circuits 32–33 are respectively characterized by their middle frequencies f01p, f0k, f02p, and by their qualities Q1p, Qk and Q2p.

Figure 2:
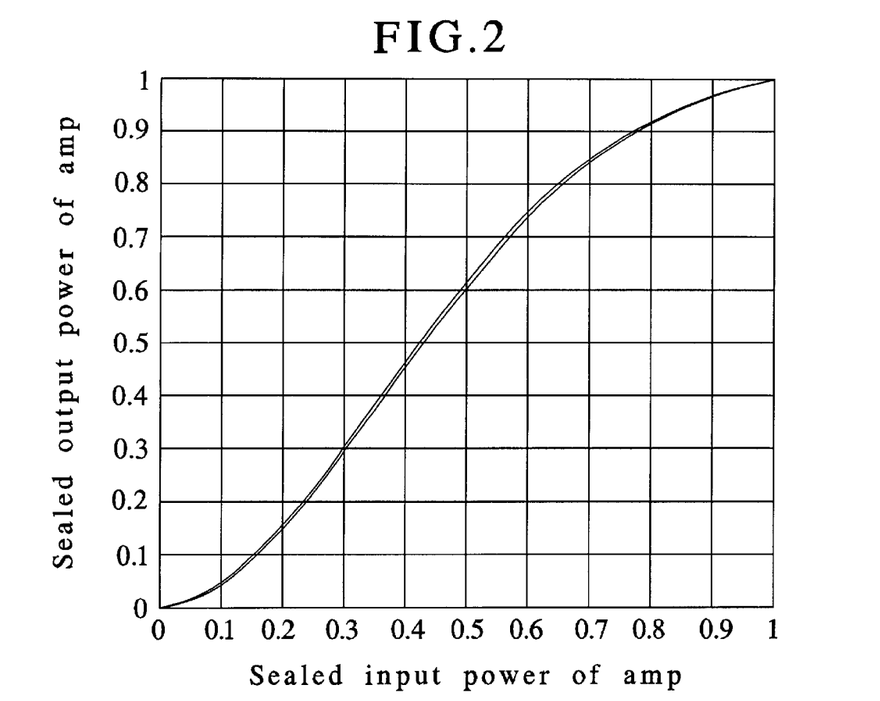
FIG. 2 illustrates the control characteristic of a non-equalized high-frequency power amplifier.
Figure 3:
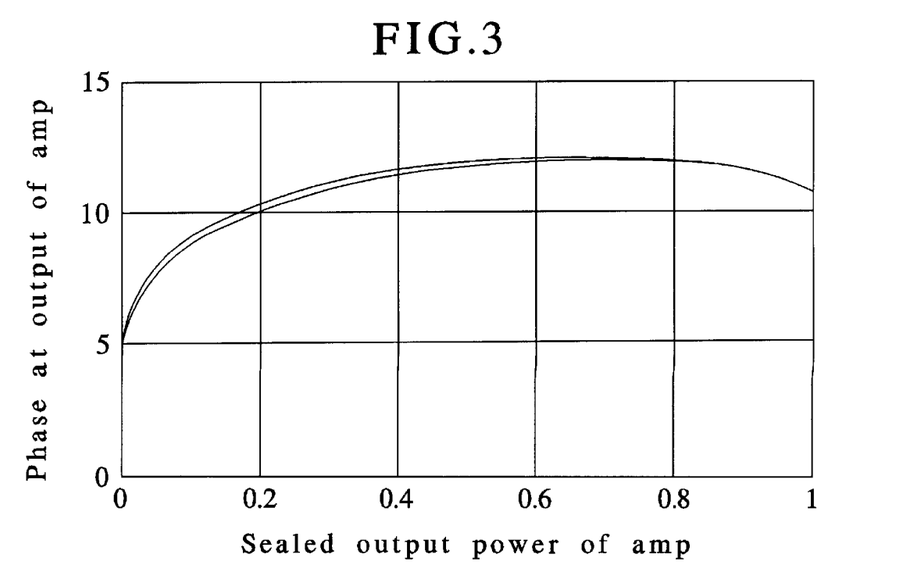
FIG. 3 illustrates the phase characteristic of a non-equalized high-frequency power amplifier.

FIG. 2 illustrates the control characteristic of a non-equalized high-frequency power amplifier 3, i.e. of a high-frequency power amplifier 3 without predistorting means 2. The input power and the output power are respectively scaled. FIG. 3 illustrates the phase at the output of the high-frequency power amplifier 3 as a function of the scaled output power. The input signal of the simulation example illustrated in FIGS. 2 and 3 is an amplitude-modulated single-carrier signal.

It can be seen clearly in FIG. 2 that the control characteristic has an S-shaped curve and is not linear. Appreciable amplitude distortions thus arise. The phase characteristic illustrated in FIG. 3 indicates that the output phase depends to a considerable degree on the output power of the high-frequency power amplifier 3. Appreciable phase distortions thus arise.

Figure 4:
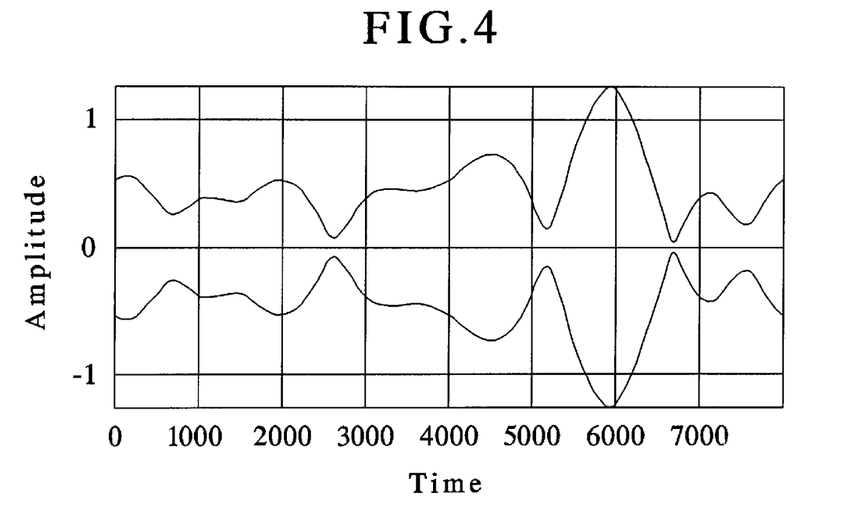
FIG. 4 illustrates a multi-carrier input signal of a non-equalized high-frequency power amplifier.

FIG. 4 illustrates a multi-carrier signal with a total of 8 useful carriers. The individual carriers are 4PSK-modulated and can therefore assume four different phase states, respectively. In the exemplary signal illustrated in FIG. 4, the following random distribution of the phases allocated to the individual carriers was assumed:

| Frequency in MHz | Phase |
| --- | --- |
| 396 | 0 |
| 397 | 0 |
| 398 | $\pi$ |
| 399 | $\frac{1}{2}\pi$ |
| 401 | 0 |
| 402 | $\pi$ |
| 403 | $\frac{1}{2}\pi$ |
| 404 | 0 |

Figure 5:
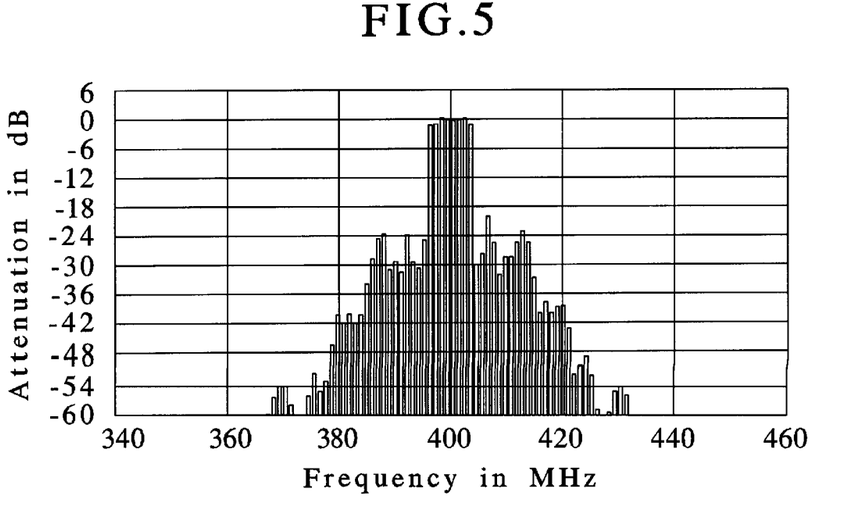
FIG. 5 illustrates the output frequency spectrum of a non-equalized high-frequency power amplifier, given the multi-carrier input signal illustrated in FIG. 4.

FIG. 5 illustrates the output spectrum of the non-equalized high-frequency power amplifier 3, i.e. without the execution of a predistorting of the input signal. Although multi-carrier signals which are used in DAB and DVB systems are actually composed of up to 8000 carriers, the simulation performed here demonstrates the basic functioning of the invention with only eight carrier frequencies. In the output spectrum illustrated in FIG. 5, it is demonstrated that, in addition to the eight carrier frequencies, a noise spectrum arises, as expected, which noise spectrum comprises a shoulder spacing of only about 18 dB relative to the useful signal. Such a small shoulder spacing is entirely insufficient in practice.

Figure 6:
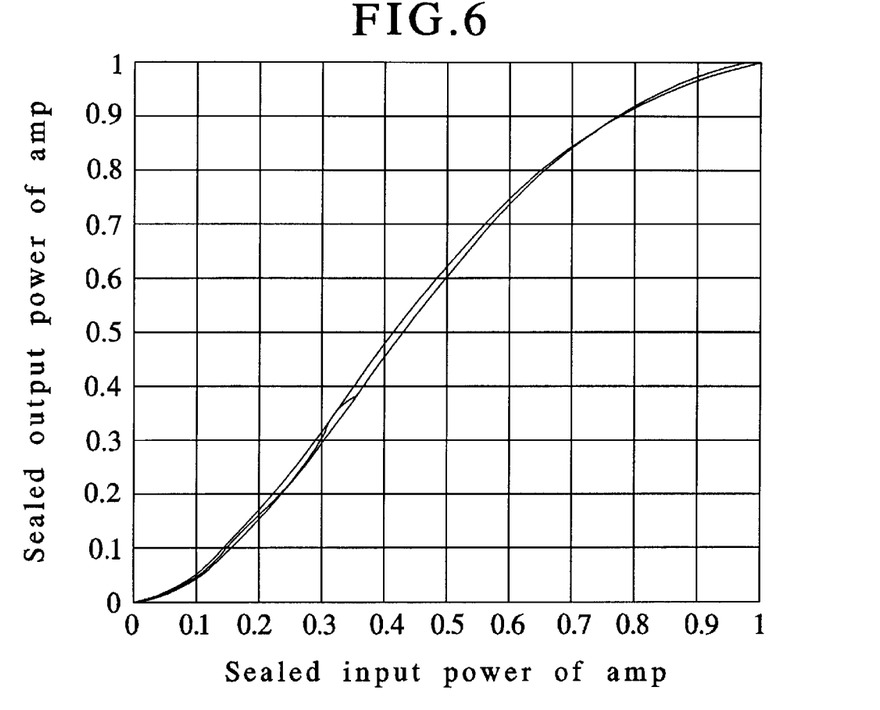
FIG. 6 illustrates the control characteristic of the non-equalized high-frequency power amplifier, given the multi-carrier input signal according to FIG. 4.
Figure 7:
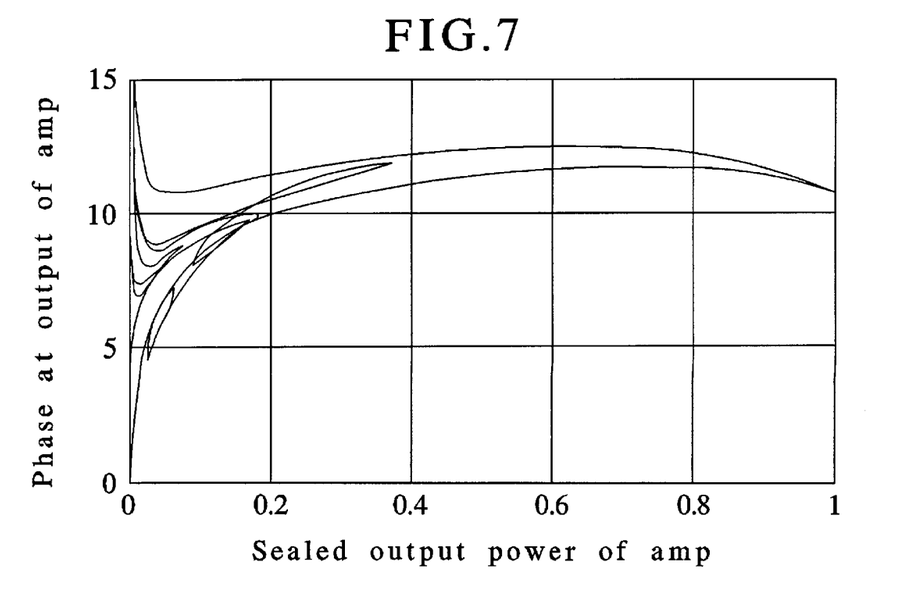
FIG. 7 illustrates the phase characteristic of the non-equalized high-frequency power amplifier, given the multi-carrier input signal corresponding to FIG. 4.

FIG. 6 illustrates the appertaining control characteristic, and FIG. 7 illustrates the appertaining phase characteristic. It is also demonstrated here that the control characteristic comprises large non-linearities, and the output phase depends to a considerable extent on the output power.

Figure 8:
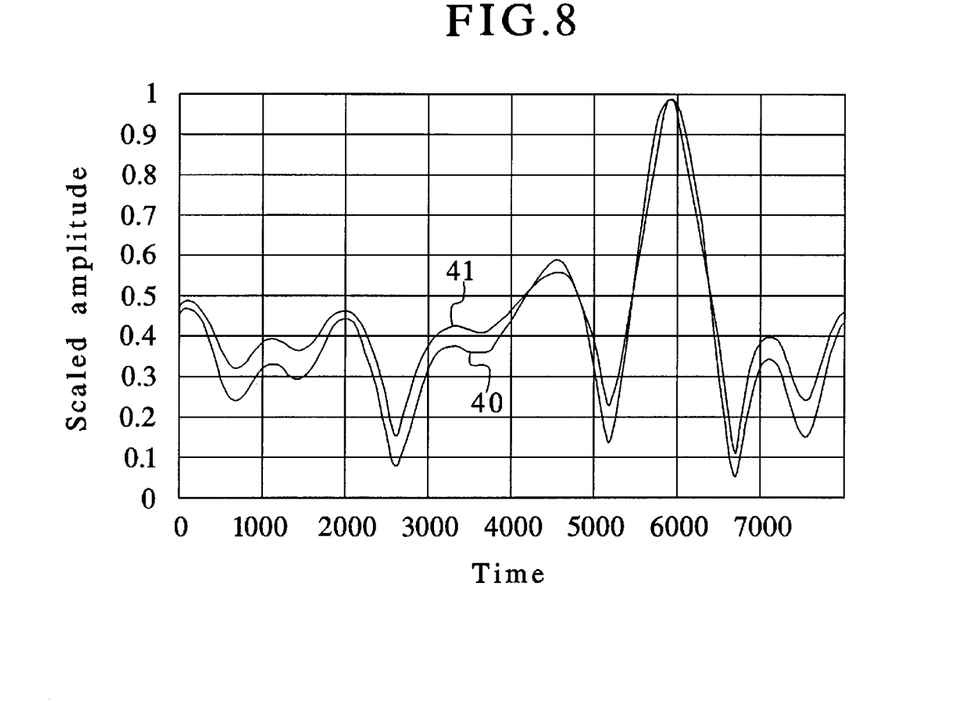
FIG. 8 illustrates the predistorted envelope curve of the multi-carrier input signal illustrated in FIG. 4, given an amplitude predistortion.
Figure 9:
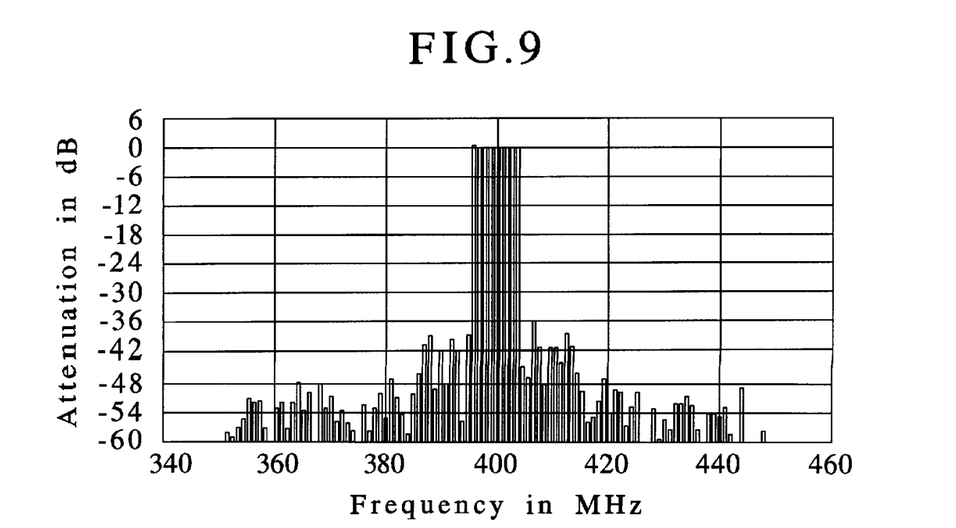
FIG. 9 illustrates the output spectrum of the high-frequency power amplifier, given a multi-carrier input signal that is predistorted in amplitude.
Figure 10:
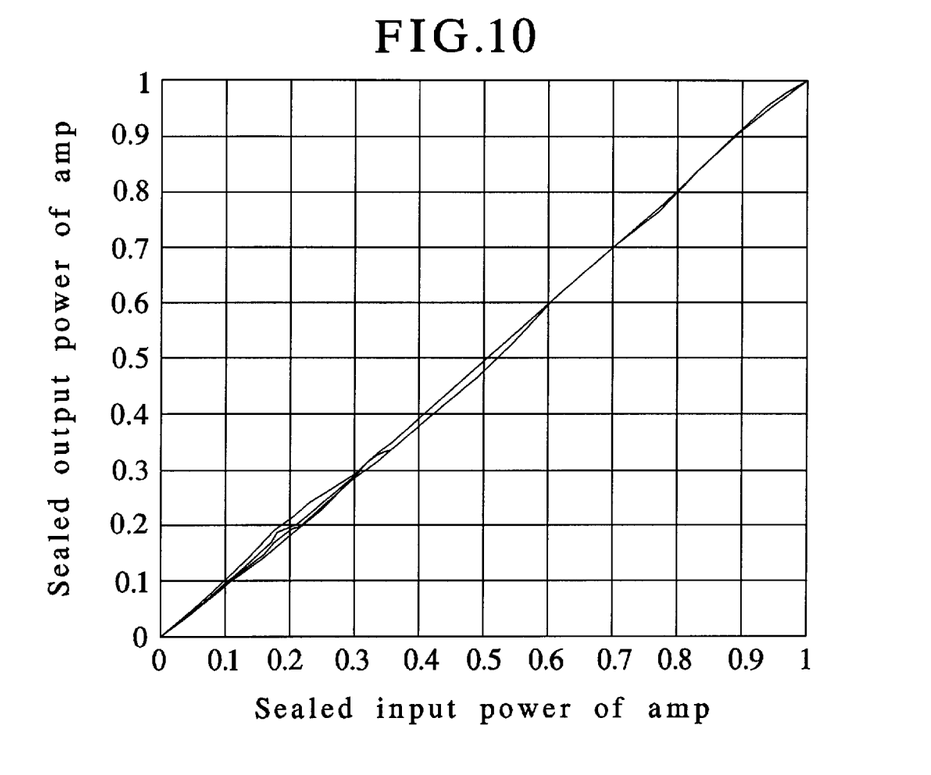
FIG. 10 illustrates the control characteristic of the high-frequency power amplifier, given a multi-carrier input signal that is predistorted in amplitude.

FIG. 8 illustrates the input envelope curve of the multi-carrier signal that is illustrated in FIG. 4, which curve is non-equalized and is provided with the reference character 40. The character 41 references the input envelope curve of an input signal which is inventively predistorted in amplitude. In the output spectrum of the high-frequency power amplifier 3 that is illustrated in FIG. 9, an appreciably enlarged shoulder spacing of 36 dB emerges between the useful signal and the noise spectrum. As can be seen in FIG. 10, due to the predistortion, the control characteristic is linearized appreciably better compared to FIG. 6.

FIG. 11 illustrates the output spectrum of the high-frequency power amplifier 3 when, in addition to an amplitude predistortion, a phase predistortion is performed. The shoulder spacing between the useful signal and the noise spectrum can be enlarged to ca. 40 dB. The phase characteristic illustrated in FIG. 12 depicts the appertaining output phase, which is approximately zero on average and which is subject to appreciably less power-dependent changes than the phase characteristic in FIG. 7 for the non-predistorted high-frequency power amplifier 3.

Although modifications and changes may be suggested by those skilled in the art, it is the intention of the inventors to embody within the patent warranted hereon all changes and modifications as reasonably and properly come within the scope of their contribution to the art.

What is claimed is:

1. A method of measuring the distortion of a high-frequency power amplifier comprising the following steps:
   a) measuring an input signal and an appertaining output signal of the high-frequency power amplifier;
   b) separating the input signal of the high-frequency power amplifier into an input envelope curve and a reference carrier;
   c) generating an output envelope curve of the output signal of the high-frequency amplifier with the aid of the reference carrier that is generated from the input signal; and
   d) displaying a control characteristic of the high-frequency power amplifier in the form of the amplitude or the power of the output envelope curve as a function of the amplitude or power of the input envelope curve.

2. The method according to claim 1, wherein in that the step of generating the output envelope curve includes synchronously demodulating the output signal.

3. The method according to claim 1, wherein in that the step of separating the input signal into the input envelope curve includes synchronously demodulating the input signal.

4. The method according to claim 1, wherein in that both an in-phase component and a quadrature component are generated by the output envelope curve in that the reference carrier is shifted 90° in phase for the generation of the quadrature component, and that the phase angle of the output envelope curve is obtained from the in-phase component and the quadrature component, and is displayed.

5. The method according to claim 4, wherein in that a phase characteristic is displayed in the form of the phase angle of the output signal as a function of the amplitude or power of the input envelope curve, or as a function of the amplitude or power of the output envelope curve.

6. The method according to claim 4, wherein in that the generation of the in-phase component and of the quadrature component occurs by separate synchronous demodulation.

7. The method according to claim 5, wherein in that the generation of the in-phase component and of the quadrature component occurs by separate synchronous demodulation.

8. The method according to claim 1, wherein in that prior to the generation of the output envelope curve, the reference carrier is shifted by a phase angle which corresponds to the signal transit-time delay caused by the high-frequency power amplifier.

9. A method for automatically equalizing a high-frequency power amplifier comprising the following steps:
   a) measuring a balancing input signal and an appertaining balancing output signal of the high-frequency power amplifier in a balancing mode;
   b) dividing the balancing input signal into an input envelope curve and a reference carrier,
   c) generating an output envelope curve from the balancing output signal of the high-frequency power amplifier with the aid of the reference carrier that is generated from the balancing input signal;
   d) generating an amplitude correction factor as a function of the amplitude of the input signal and dependent on the ratio of the amplitudes of the output envelope signal and the input envelope signal of the balancing signal that is measured in the balancing mode; and
   e) performing an automatic amplitude predistortion by connecting the amplitude of the input signal of the high-frequency power amplifier by the amplitude correction factor.

10. The method according to claim 9, wherein in that both an in-phase component and a quadrature component are generated by the output envelope curve in that the reference carrier is shifted 90° in phase for the generation of the quadrature component, and that the phase angle of the output envelope curve is obtained from the in-phase component and the quadrature component, generating a phase correction factor as a function of the amplitude of the input signal dependent on the phase angle of the output envelope curve of the balancing signal that is measured in the balancing mode, and performing an automatic phase predistortion by correcting the phase of the input signal of the high-frequency power amplifier by the phase correction factor.

11. The method according to claim 10, wherein the in-phase component and of the quadrature component occurs by separate synchronous demodulation.

12. The method according to claim 9, wherein the amplitude correction factor, and the phase correction factor, as warranted, are fed to a predistorting means, whose control characteristic and phase characteristic are automatically set inversely to the control characteristic and to the phase characteristic of the high-frequency power amplifier by the amplitude correction factor and by the phase correction factor.

13. The method according to claim 9, wherein the input envelope curve, the output envelope curve, or respectively, the in-phase component and the quadrature component of the output envelope curve are digitized, and the amplitude correction factor and, as warranted, the phase correction factor are calculated in a control computer.

14. The method according to claim 9, wherein the balancing signal is an amplitude-modulated single-carrier signal.

15. The method according to claim 9, wherein the balancing signal is a multi-carrier signal, all the carriers of the multi-carrier signal being in the same phase state.

16. The method according to claim 9, wherein the high-frequency power amplifier is a modular construction of several subamplifiers which function in parallel fashion, and that the measuring of the balancing input signal and of the appertaining balancing output signal in the balancing mode occurs using only one of the subamplifiers, the amplitude correction factor, as warranted, the phase correction factor, that are generated for this subamplifier being accepted for the other subamplifiers.

17. An apparatus which measures the distortion of a high-frequency power amplifier, comprising:
   a) a reference carrier generator which generates a reference carrier from a measured input signal of the high-frequency power amplifier;
   b) a first synchronous demodulator which generates an input envelope curve from the measured input signal and the reference carrier;
   c) a second synchronous demodulator which generates an in-phase component of an output envelope curve from the measured output signal of the high-frequency power amplifier and from the reference carrier;
   d) a phase shifter which shifts the phase of the reference carrier 90°;
   e) a third synchronous demodulator which generates a quadrature component of the output envelope curve from the measured output signal of the high-frequency power amplifier and from the reference carrier, which has been shifted 90° in phase;
   f) a first display which displays a control characteristic of the high-frequency power amplifier in the form of the amplitude or power of the output envelope curve as a function of the amplitude or power of the input envelope curve; and g) a second display which displays a phase characteristic of the high-frequency power amplifier in the form of the phase angle of the output signal, which is defined by the ratio of the quadrature component to the in-phase component, as a function of the amplitude or power of the input envelope curve or as a function of the amplitude or power of the output envelope curve.

18. An equalization apparatus which automatically equalizes a high-frequency power amplifier, comprising:

a) a reference carrier generator which generates a reference carrier from a measured balancing input signal of the high-frequency power amplifier;

b) a first synchronous demodulator which generates an input envelope curve from the measured balancing input signal and from the reference carrier;

c) a second synchronous demodulator which generates an in-phase component of an output envelope curve from a measured balancing output signal of the high-frequency power amplifier and from the reference carrier;

d) a phase shifter which shifts the phase of the reference carrier 90°;

e) a third synchronous demodulator which generates a quadrature component of the output envelope curve from the measured output signal of the high-frequency power amplifier and from the reference carrier, which has been shifted 90° in phase;

f) a controller which generates an amplitude correction control signal and/or a phase correction control signal from the input envelope curve, the in-phase component of the output envelope curve and/or the quadrature component of the output envelope curve; and g) a signal predistorter means, whose control characteristic and phase characteristic are adjusted in the balancing mode inversely to the control characteristic and/or the phase characteristic of the high-frequency power amplifier, by the amplitude correction factor and/or by the phase correction factor, respectively;

wherein, the control characteristic is defined by the amplitude or power of the output envelope curve as a function of the amplitude or power of the input envelope curve, and the phase characteristic is defined by the phase angle of the output signal as a function of the amplitude or power of the input envelope curve or as a function of the amplitude or power of the output envelope curve.

* * * * *